United States Patent [19]

Semi

[11] Patent Number: 5,327,376
[45] Date of Patent: Jul. 5, 1994

[54] STATIC MEMORY CELL

[75] Inventor: Atsushi Semi, Gose, Japan

[73] Assignee: Sharp Kabushiki Kaisha, Osaka, Japan

[21] Appl. No.: 25,368

[22] Filed: Feb. 24, 1993

[30] Foreign Application Priority Data

Feb. 25, 1992 [JP] Japan .................................. 4-038097

[51] Int. Cl.$^5$ ............................................. B11C 13/00
[52] U.S. Cl. ............................... 365/154; 365/189.01; 365/189.08
[58] Field of Search ................ 365/154, 189.01, 189.08

[56] References Cited

U.S. PATENT DOCUMENTS 5,132,929  7/1992  Ochii ..................................... 365/154

FOREIGN PATENT DOCUMENTS 62-121998  6/1987  Japan .

Primary Examiner—Terrell W. Fears
Attorney, Agent, or Firm—Morrison & Foerster

[57] ABSTRACT

A static memory cell is connected to a first bit line and a second bit line, and includes the following: a first inverter section having a first input and a first output; a second inverter section having a second input connected to a first output through a first node, and a second output connected to the first input through a second node; a first switching section for allowing or not allowing conduction between the first bit line and the first node; a first capacitor arranged between the second bit line and the first node; a second switching section for allowing or not allowing conduction between the second bit line and the second node; and a second capacitor arranged between the first bit line and the second node.

5 Claims, 4 Drawing Sheets

STATIC MEMORY CELL

BACKGROUND OF THE INVENTION

1. Field of the Invention

The present invention relates to a static memory cell used as a memory cell for an SRAM (static random access memory).

2. Description of the Related Art

FIG. 6 exemplifies a static memory cell used for a conventional SRAM. This static memory cell comprises a flip-flop circuit 10 formed of a first inverter circuit 1 and a second inverter circuit 2 so as to have a capacity to record data of 1 bit. In the first inverter circuit 1, a resistance 1a and an n-channel Metal Oxide Semiconductor Field Effects Transistor (MOSFET) 1b are connected in series between a power source ($V_{cc}$) and the ground (GND). Similarly, in the second inverter circuit 2, a resistance 2a and an n-channel MOSFET 2b are connected in series between the $V_{cc}$ and the GND. A gate of the n-channel MOSFET 1b functions as an input of the first inverter circuit 1, and a first connector node 3 between the resistance 1a and the n-channel MOSFET 2b functions as an output of the first inverter circuit 1. A gate of the n-channel MOSFET 2b functions as an input of the second inverter circuit 2, and a second connector node 4 between the resistance 2a and the n-channel MOSFET 1b functions as an output of the second inverter circuit 2. The output of the first inverter circuit 1 is connected to the input of the second inverter circuit 2 through the first connector node 3. The output of the second inverter circuit 2 is connected to the input of the first inverter circuit 1 through the second connector node 4. In the flip-flop circuit 10 consisting of the inverter circuits 1 and 2, when the voltage level of the first connector node 3 is high, the n-channel MOSFET 2b of the second inverter circuit 2 is in an ON-state, so that the voltage level of the second connector node 4 is stabilized low. Similarly, when the voltage level of the second connector node 4 is high, the n-channel MOSFET 1b of the first inverter circuit 1 is in the ON-state, so that the voltage level of the first connector node 3 is stabilized low.

The connector node 3 is connected to a first bit line B through a transfer gate 5. The connector node 4 is connected to a second bit line $\overline{B}$ through a transfer gate 6. The transfer gates 5 and 6 are each consisted of an n-channel MOSFET and connected to the same word line WL. Thus, they are each controlled so as to be turned to the ON-state or OFF-state simultaneously. The voltage levels of the bit lines B and $\overline{B}$ are set to be high and low, complementarily.

In the case where data is written on the above-mentioned static memory cell, the voltage levels of the bit lines B and $\overline{B}$ are set to be high and low, or to be low and high respectively, and then the voltage level of the word line WL is turned to be high. Now assuming that the voltage level of the first bit line B is set to be high and that of the second bit line $\overline{B}$ is set to be low, the two transfer gates 5 and 6 are turned to the ON-state when the voltage level of the word line WL is turned to be high. As a result, the voltage level of the first connector node 3 becomes high and that of the second connector node 4 becomes low. Even after the voltage level of the word line WL is turned back to be low and the two transfer gates 5 and 6 are turned to the OFF-state, the voltage level of the first connector node 3 is maintained at high, and that of the second connector node 4 is maintained at low, thereby realizing data writing.

In the case where the data is read from the static memory cell, the voltage levels of the bit lines B and $\overline{B}$ are made so as to have the same voltage, and then the voltage level of the word line WL is turned to be high. Now assuming that the voltage level of the first connector node 3 is maintained at high as described above, the voltage level of the word line WL is turned to be high, so that the two transfer gates 5 and 6 are turned to the ON-state. Thus, the voltage of the first bit line B is increased due to the voltage level (high level) of the first connector node 3, and the voltage of the second bit line $\overline{B}$ is decreased due to the voltage level (low level) of the second connector node 4. The potential difference between the increased potential of the first bit line B and the decreased potential of the second bit line $\overline{B}$ is amplified by a differential amplifier (not shown), thereby realizing data reading.

However, the above-mentioned conventional static memory cell has a disadvantage in that the inverter circuits 1 and 2 are not positively operated when the voltage of the $V_{cc}$ is low.

For example, in the case where the voltage level of the first connector node 3 is low and that of the second connector node 4 is high, the voltage levels of the bit lines B and $\overline{B}$ are set to be high and low, respectively at the time of $t_{11}$, and then the voltage level of the word line WL is turned so as to be high. In this case, the voltage of the first connector node 3 is gradually increased, while the voltage of the second connector node 4 is decreased to the voltage level of the GND as shown in FIG. 7. Herein, the n-channel MOSFET 1b of the first inverter circuit 1 is turned to the OFF-state due to a decrease of the voltage of the second connector node 4. On the other hand, the n-channel MOSFET 2b of the second inverter circuit 2 is turned to the ON-state due to a sufficient increase of the voltage of the first connector node 3. Thus, data is positively written on and stored in the memory cell.

However, as shown in FIG. 7, in the case where the voltage of the $V_{cc}$ is low, so that the voltage of the first connector node 3 is not increased up to the threshold voltage $V_{th}$, the n-channel MOSFET 2b of the second inverter circuit 2 is not positively turned to the ON-state. Accordingly, when the voltage level of the word line WL is turned to be low at the time of $t_{12}$, and the two transfer gates 5 and 6 are turned back to be in the OFF-state, the voltage of the second connector node 4 is increased to some extent from the voltage level of the GND, and thus the potential difference $V_d$ between the connector nodes 3 and 4 still remain insufficient. When the data is read under this situation, the potential difference between the bit lines B and $\overline{B}$ is so insufficient that the differential amplifier cannot be operated normally.

As is apparent from the above, in the case where the voltage of the $V_{cc}$ is low, the n-channel MOSFETs 1b and 2b may not be operated normally, and thus data cannot be read from the static memory cell.

SUMMARY OF THE INVENTION

The static memory cell of this invention is connected to a first bit line and a second bit line, and comprises the following: a first inverter means including a first input and a first output; a second inverter means including a second input connected to a first output through a first node, and a second output connected to the first input through a second node; a first switching means for allowing or not allowing conduction between the first bit line and the first node; a first capacitor arranged between the second bit line and the first node; a second switching means for allowing or not allowing conduction between the second bit line and the second node; and a second capacitor arranged between the first bit line and the second node.

In an embodiment, the first inverter means comprises a first load element and a first MOSFET connected in series between a power source and the ground. The gate of the first MOSFET functions as the first input. A node connected to the first load element and the first MOSFET functions as the first output. The second inverter means comprises a second load element and a second MOSFET connected in series between the power source and the ground. The gate of the second MOSFET functions as the second input. A node connected to the second load element and the second MOSFET functions as the second output.

In another embodiment, the first and second load elements are resistances.

In still another embodiment, the first and second load elements are MOSFETs. A gate of the first MOSFET is connected to a drain of the first MOSFET itself, and a gate of the second MOSFET is connected to a drain of the second MOSFET itself.

In yet still another embodiment, the first inverter means comprises a first p-channel MOSFET and a first n-channel MOSFET connected in series between a power source and the ground. The gates of the first p-channel MOSFET and the first n-channel MOSFET function as the first input. A node connected to the first p-channel MOSFET and the first n-channel MOSFET functions as the first output. The second inverter means comprises a second p-channel MOSFET and a second n-channel MOSFET connected in series between the power source and the ground . The gates of the second p-channel MOSFET and the second n-channel MOSFET function as the second input. A node connected to the second p-channel MOSFET and the second n-channel MOSFET functions as the second output.

According to the present invention, it is possible to set the voltage of one of the first and second nodes to be beyond a threshold voltage of the corresponding one of the first and second inverter means, as described below referring to the first node and the first inverter means. In the case where the two switching means are turned so as to be in an ON-state, the voltage level of the first node is turned to be high since the voltage level of the first bit line is high. In this case, the first capacitor between the first node and the second bit line is charged. The voltage level of the second bit line is low. In the case where the two switching means are turned to be in an OFF-state and then the two bit lines are made so as to have the same voltage, the voltage of the charged first capacitor on the side of the second bit line is increased from the low level. As a result, the voltage of the first capacitor on the side of the first node is also further increased. Therefore, in the case where the two transfer gates are turned to be in the ON-state, the voltage of the first inverter means can be positively increased so as to be beyond the threshold of the first inverter means by charge coupling.

Thus, the invention described herein makes possible the advantage of writing data on and reading data from the static memory cell even in the case where the voltage of the power source is low.

These and other advantages of the present invention will become apparent to those skilled in the art upon reading and understanding the following detailed description with reference to the accompanying FIGURES.

DESCRIPTION OF THE PREFERRED EMBODIMENTS

Hereinafter, the present invention will be described by way of illustrating examples.

EXAMPLE 1

Figure 1:
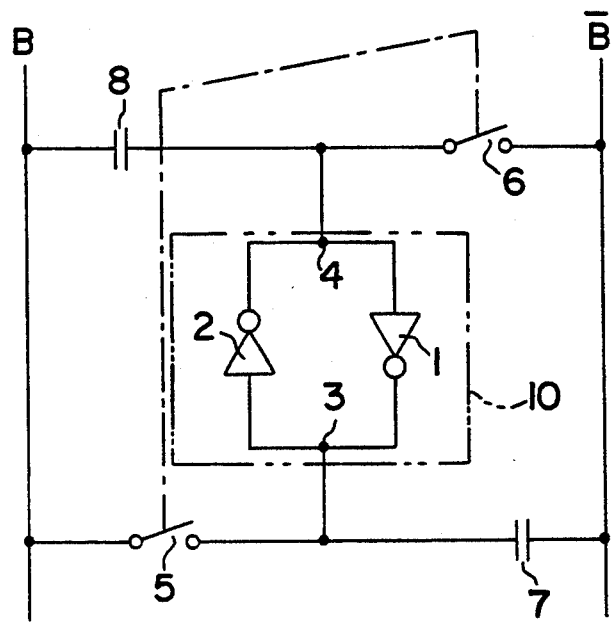
FIG. 1 is a circuit block diagram of a static memory cell according to a first example of the present invention.
Figure 6:
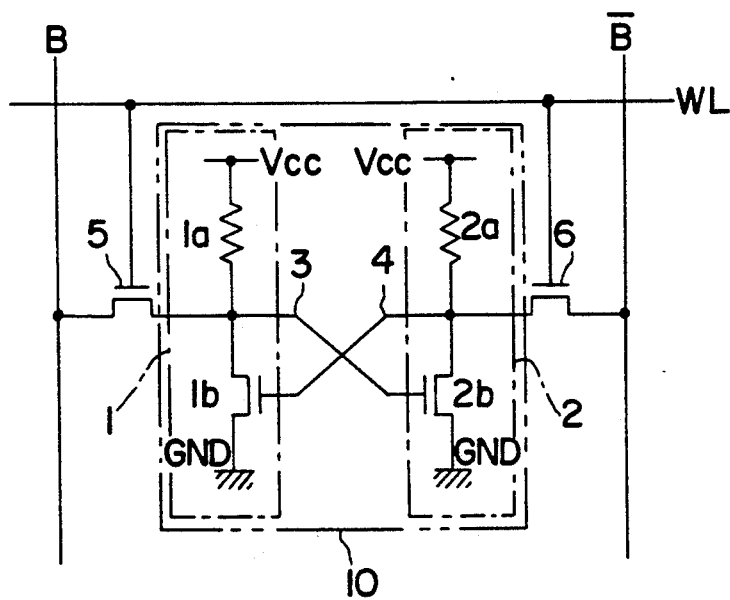
FIG. 6 is a circuit diagram of a conventional static memory cell.
Figure 7:
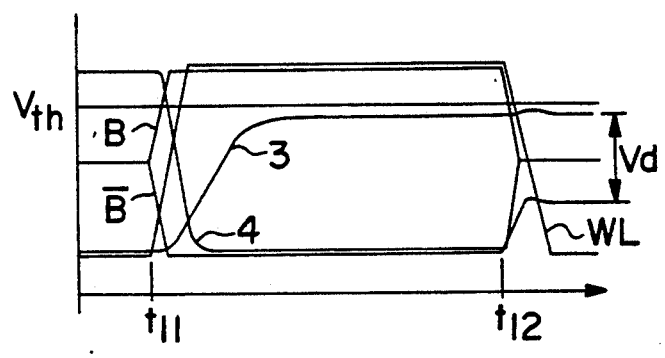
FIG. 7 is a timing chart of writing operation of the conventional static memory cell.

FIG. 1 shows a circuit block diagram of a static memory cell according to a first example of the present invention. In FIG. 1, components having the same function as those shown in FIG. 6 are denoted with the same reference numerals.

The static memory cell of this example includes a first inverter circuit 1 and a second inverter circuit 2 constituting a flip-flop circuit 10. Each of the inverter circuits 1 and 2 outputs a low voltage when an input voltage is high beyond a threshold voltage $V_{th}$, and outputs a high voltage when the input voltage is low. An output of the first inverter circuit 1 is connected to an input of the second inverter circuit 2 through a first connector node 3. An output of the second inverter circuit 2 is connected to an input of the first inverter circuit 1 through a second connector node 4. In the flip-flop circuit 10 formed of the inverter circuits i and 2, when the voltage level of the first connector node 3 is high, the voltage level of the second connector node 4 is stabilized low. Similarly, when the voltage level of the second connector node 4 is high, the voltage level of the first connector node 3 is stabilized low.

The first connector node 3 is connected to a first bit line B through a transfer gate 5, and connected to a second bit line $\overline{B}$ through a first capacitor 7. The second connector node 4 is connected to the second bit line $\overline{B}$ through a transfer gate 6 and connected to the first bit line B through a second capacitor 8 . The transfer gates 5 and 6 consist of an optional switching circuit and are controlled so as to be turned to an ON-state or OFF-state simultaneously. The voltage levels of the bit lines B and $\overline{B}$ are set to be high and low, complementally.

Hereinafter, the operation of the above static memory cell will be described.

In the case where data is written on the static memory cell, the voltage levels of the bit lines B and $\overline{B}$ are set so as to be high and low, or to be low and high respectively, and then the two transfer gates 5 and 6 are turned to the ON-state. Now assuming that the voltage level of the first bit line B is set to be high and that of the second bit line $\overline{B}$ is set to be low, the voltage level of the first connector node 3 becomes high and that of the second connector node 4 becomes low. Even after the two transfer gates 5 and 6 are turned to the OFF-state, the voltage level of the first connector node 3 is maintained at high, and that of the second connector node 4 is maintained at low, thereby realizing data writing and storage.

In the case where the data is read from the static memory cell, the bit lines B and $\overline{B}$ are made so as to have the same voltage and the two transfer gates 5 and 6 are turned to the ON-state. Now assuming that the voltage level of the first connector node 3 is maintained at high as described above, in the case where the two transfer gates 5 and 6 are turned to the ON-state, the voltage of the first bit line B is increased due to the voltage level (high level) of the first connector node 3, and the voltage of the second bit line $\overline{B}$ is decreased due to the voltage level (low level) of the second connector node 4. The potential difference between the increased potential of the first bit line B and the decreased potential of the second bit line $\overline{B}$ is amplified by a differential amplifier (not shown), thereby realizing data reading.

In the case where the voltage of a $V_{cc}$ is low when data is written, the voltage level of the first connector node S does not become sufficiently high, even after the transfer gate 5 is turned to the ON-state. Conventionally, in the case where the voltage of the first connector node S is below the threshold voltage of the second inverter circuit 2, the second inverter circuit 2 is not operated, and thus the voltage of the second connector node 4 is somewhat increased after the transfer gates 5 and 6 are turned to the OFF-state.

However, according to the present example, in the case where the transfer gate 5 is turned to the ON-state, and the voltage of the first connector node S is increased, the first capacitor 7 is charged. Since the first capacitor 7 is connected to the first connector node S and the second bit line $\overline{B}$, a terminal voltage of the first capacitor 7 is increased up to a value close to the potential difference between the bit lines B and $\overline{B}$. Thereafter, the transfer gates 5 and 6 are turned to the OFF-state, and then the bit lines B and $\overline{B}$ are made so as to have the same voltage by a short circuit or the like. As a result, the voltage of the second bit line $\overline{B}$ is increased from the low level up to an approximately mean value between the low and high levels. Thus, the voltage of the first capacitor 7 on the side of the first connector node 3 is similarly increased by charge coupling. In the case where the voltage of the first connector node 3 is increased, the input voltage of the second inverter circuit 2 increases beyond the threshold voltage. Thus, the second inverter circuit 2 can positively output a low voltage so that the second connector node 4 can be maintained a sufficiently low voltage. In the case where the data is read from the static memory cell, the inverter circuits 1 and 2 are positively operated so as to maintain their voltage levels. Therefore, the potential difference between the bit lines B and $\overline{B}$ is large enough to be read correctly by the differential amplifier.

As is apparent from the above, data can positively be written on and read from the static memory cell according to the first example, even in the case where the voltage of the power source is low.

EXAMPLE 2

Figure 2:
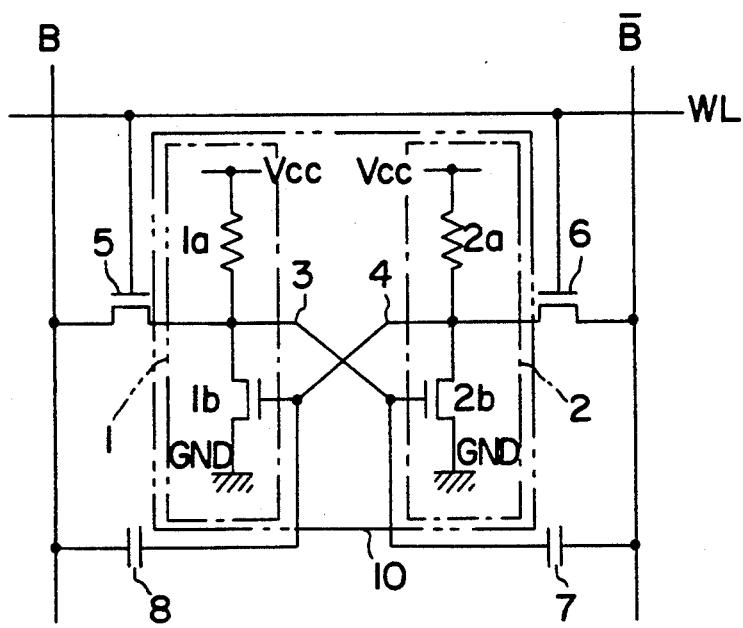
FIG. 2 is a circuit diagram of a static memory cell according to a second example of the present invention.
Figure 3:
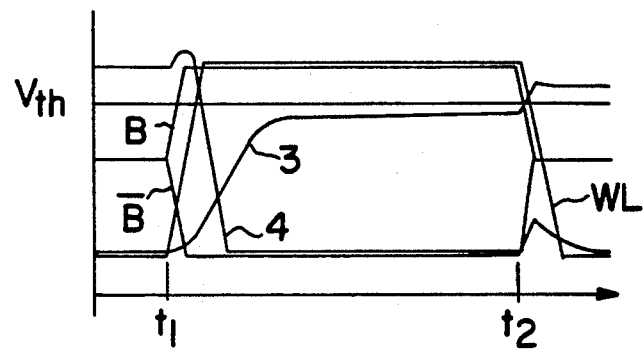
FIG. 3 is a timing chart of writing operation of the static memory cell of FIG. 2.

FIG. 2 shows a circuit diagram of a static memory cell according to a second example of the present invention. FIG. 3 shows a timing chart of writing operation of the static memory cell. In FIGS. 2 and 3, components having the same function as those shown in FIGS. 1 and 6 are denoted with the same reference numerals.

The static memory cell of the second example comprises a flip-flop circuit 10 formed of a first inverter circuit 1 and a second inverter circuit 2. In the first inverter circuit 1, a resistance 1a and an n-channel MOSFET 1b are connected in series between a $V_{cc}$ and the GND. A gate of the n-channel MOSFET 1b functions as an input of the first inverter circuit 1, and a first connector node 3 between the resistance 1a and the n-channel MOSFET 2b functions as an output of the first inverter circuit 1. Similarly, in the second inverter circuit 2, a resistance 2a and an n-channel MOSFET 2b are connected in series between the $V_{cc}$ and the GND. A gate of the n-channel MOSFET 2b functions as an input of the second inverter circuit 2, and a second connector node 4 between the resistance 2a and the n-channel MOSFET 1b functions as an output of the second inverter circuit 2.

According to the second example, the transfer gates 5 and 6 are each formed of an n-channel MOSFET, and the gates of the MOSFETs are connected to the same word line WL. Thus the transfer gates 5 and 6 are each controlled so as to be turned to the ON-state or OFF-state simultaneously.

Hereinafter, the operation of the above static memory cell will be described.

In the case where data is written on the above-mentioned static memory cell, the voltage levels of the bit lines B and $\overline{B}$ are set so as to be high and low, or to be low and high respectively, and then the voltage level of the word line WL is turned to be high.

For example, in the case where the voltage level of the first connector node 3 is low and that of the second connector node 4 is high, the voltage levels of the bit lines B and $\overline{B}$ are set to be high and low, respectively at the time of $t_1$, and then the voltage level of the word line WL is turned so as to be high, the transfer gates 5 and 6 are turned to the ON-state, so that the voltage of the first connector node 3 is gradually increased, and a first capacitor 7 is charged as shown in FIG. 3. The voltage of the second connector node 4 is once increased by a charged second capacitor 8 when the voltage of the first bit line B is set so as to be high. However, the voltage of the second connector node 4 is immediately decreased to the voltage level of the GND since the second connector node 4 is connected to the second bit line $\overline{B}$ of which voltage level is low through the transfer gate 6. In the case where the voltage of the second connector node 4 is decreased, the n-channel MOSFET 1b is turned to the OFF-state, and the n-channel MOSFET 2b would be turned to the ON-state with a proviso that the voltage of the first connector node 3 is sufficiently high.

However, in the case where the voltage of the $V_{cc}$ is low as seen in FIG. 3, the voltage of the first connector node 3 is a little below the threshold voltage $V_{th}$ of the n-channel MOSFET 2b while the transfer gates 5 and 6 are in the ON- state. As a result, the n-channel MOSFET 2b remains in the OFF-state.

However, it is possible to turn the n-channel MOSFET 2b to the ON-state by the following steps: First, the voltage level of the word line WL is turned to be low at the time of $t_2$, so that the transfer gates 5 and 6 are turned back to the OFF- state. The bit lines B and $\overline{B}$ are made so as to have the same voltage by a short circuit or the like, so that the voltage of the second bit line $\overline{B}$ is increased from the low level up to an approximately mean value between the low and high levels. Thus, the voltage of the first capacitor 7 on the side of the first connector node 3 is similarly increased by charge coupling. Therefore, the voltage of the first connector node 3 can be increased beyond the threshold voltage of the second inverter circuit 2. Thus, the n-channel MOSFET 2b is positively turned to the ON-state, so that the voltage of the second connector node 4 can be maintained at the voltage level of the GND.

In the case where the data is read from the static memory cell, the inverter circuits 1 and 2 are positively operated, thereby maintaining their voltage levels. Therefore, the potential difference between the bit lines B and $\overline{B}$ is large enough so as to be read correctly by a differential amplifier.

As is apparent from the above, it is also possible to write data on and read the data from the static memory cell according to the second example, even in the case where the voltage of the power source is low.

EXAMPLE 3

Figure 4:
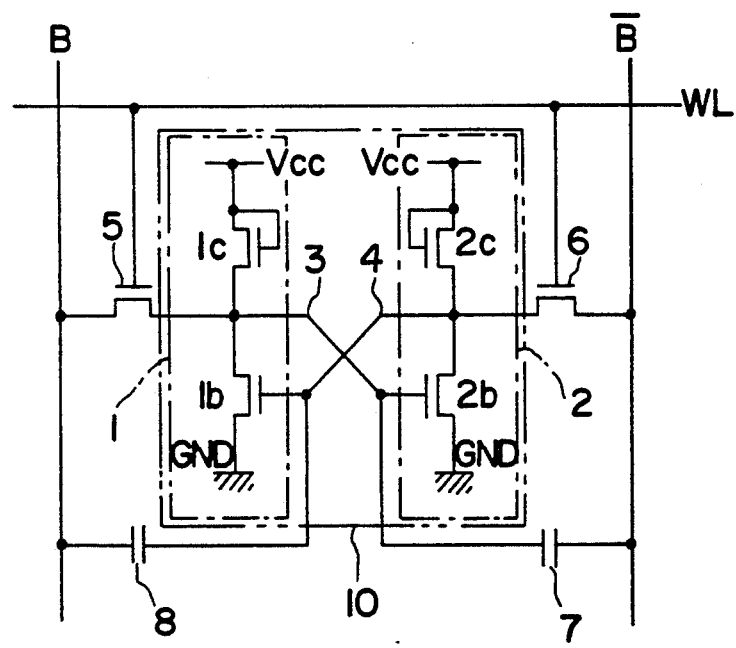
FIG. 4 is a circuit diagram of a static memory cell according to a third example of the present invention.

FIG. 4 shows a circuit diagram of a static memory cell according to a third example of the present invention. In FIG. 4, components having the same function as those shown in FIGS. 1 and 2 are denoted with the same reference numerals.

The static memory cell is configured in the same way as that of the second example except that the resistances 1a and 2a are replaced with n-channel MOSFETs 1c and 2c, respectively. A gate of the n-channel MOSFET 1c is connected to a drain of the n-channel MOSFET 1c itself, and a gate of the n-channel MOSFET 2c is connected to a drain of the n-channel MOSFET 2c itself. Accordingly, the n-channel MOSFETs 1c and 2c can output almost linear current in proportion to the voltage of a $V_{cc}$, and thus they have the same functions as those of the resistances 1a and 2a of the second example. Therefore, it is also possible to write data on and read the data from the static memory cell according to the third example, even in the case where the voltage of the power source is low.

EXAMPLE 4

Figure 5:
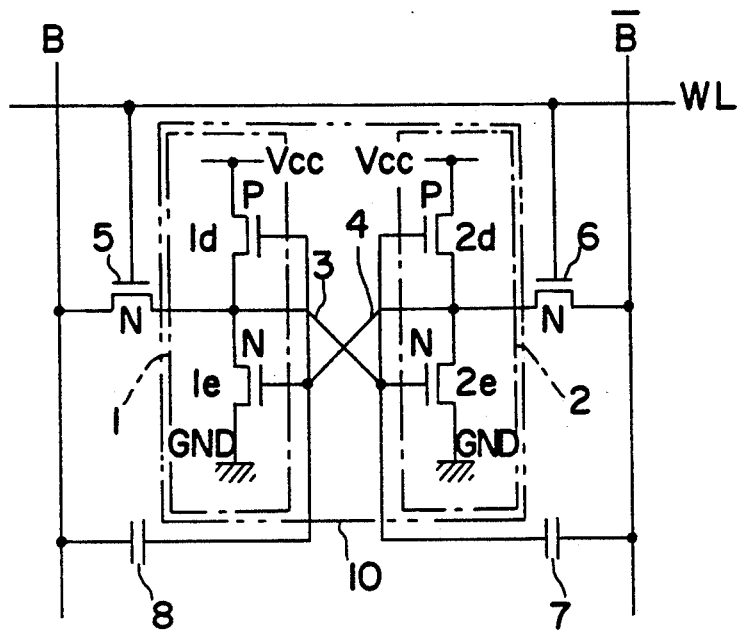
FIG. 5 is a circuit diagram of a static memory cell according to a fourth example of the present invention.

FIG. 5 shows a circuit diagram of a static memory cell according to a fourth example of the present invention. In FIG. 5, components having the same function as those shown in FIGS. 1, 2, and 4 are denoted with the same reference numerals.

The static memory cell is configured in the same way as that of the second example except that the inverter circuits i and 2 are each formed of a Complementary Metal Oxide Semiconductor Field Effects Transistor (CMOSFET). In the first inverter circuits 1, a p-channel MOSFET 1d and an n-channel MOSFET 1e are connected in series between a $V_{cc}$ and the GND. In the second inverter circuit 2, a p-channel MOSFET 2d and an n-channel MOSFET 2e are connected in series between the $V_{cc}$ and the GND. Accordingly, the static memory cell of the present example is operated in the same way as the static memory cells of the above examples except that each output of the inverter circuits 1 and 2 is changed into a totempole output. Therefore, it is also possible to write data on and read the data from the static memory cell according to the fourth example in the same manner as the second example, even in the case where the voltage of the power source is low.

It is also obvious that the same effects can be obtained even in the case where the n-channel MOS-FETs shown in FIGS. 2 and 4 are replaced with p-channel MOSFETs, and the n-channel MOSFETs and p-channel MOSFETs shown in FIG. 5 are replaced with each other so as to invert the polarity of the power source.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A static memory cell connected to a first bit line and a second bit line, comprising:
    a first inverter means including a first input terminal and a first output terminal;
    a second inverter means including a second input terminal connected to a first output terminal through a first node, and a second output terminal connected to the first input terminal through a second node;
    a first switching means for allowing or not allowing conduction between the first bit line and the first node;
    a first capacitor connected between the second bit line and the first node;
    a second switching means for allowing or not allowing conduction between the second bit line and the second node; and
    a second capacitor connected between the first bit line and the second node.

2. A static memory cell according to claim 1, wherein the first inverter means comprises a first load element and a first MOSFET connected in series between a power source and the ground, the gate of the first MOSFET functioning as the first input terminal, a node connected to the first load element and the first MOSFET functioning as the first output terminal; and the second inverter means comprises a second load element and a second MOSFET connected in series between the power source and the ground, the gates of the second MOSFET functioning as the second input terminal, a node connected to the second load element and the second MOSFET functioning as the second output terminal.

3. A static memory cell according to claim 2, wherein the first and second load elements are resistances.

4. A static memory cell according to claim 2, wherein the first and second load elements are MOSFETs, and a gate of the first MOSFET is connected to a drain of the first MOSFET itself, and a gate of the second MOSFET is connected to a drain of the second MOSFET itself.

5. A static memory cell according to claim 1, wherein the first inverter means comprises a first p-channel MOSFET and a first n-channel MOSFET connected in series between a power source and the ground, the gates of the first p-channel MOSFET and the first n-channel MOSFET functioning as the first input terminal, a node connected to the first p-channel MOSFET and the first n-channel MOSFET functioning as the first output terminal; and the second inverter means comprises a second p-channel MOSFET and a second n-channel MOSFET connected in series between the power source and the ground, the gate of the second p-channel MOSFET and the second n-channel MOSFET functioning as the second input terminal, a node connected to the second p-channel MOSFET and the second n-channel MOSFET functioning as the second output terminal.

* * * * *